United States Patent
Xu et al.

(10) Patent No.: US 7,851,342 B2
(45) Date of Patent: Dec. 14, 2010

(54) IN-SITU FORMATION OF CONDUCTIVE FILLING MATERIAL IN THROUGH-SILICON VIA

(75) Inventors: Dingying Xu, Maricopa, AZ (US); Amram Eitan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 11/694,902

(22) Filed: Mar. 30, 2007

(65) Prior Publication Data

US 2008/0242079 A1    Oct. 2, 2008

(51) Int. Cl.
*H01L 21/44* (2006.01)
*H01L 21/4763* (2006.01)

(52) U.S. Cl. .............. 438/597; 438/618; 438/629; 438/640; 438/678; 257/698; 257/E23.011; 257/E23.131; 257/E23.174; 257/E21.585

(58) Field of Classification Search .............. 438/597, 438/618
See application file for complete search history.

(56) References Cited

U.S. PATENT DOCUMENTS

| | | | | |
|---|---|---|---|---|
| 3,288,747 A | * | 11/1966 | Sussman | 523/200 |
| 3,723,223 A | * | 3/1973 | Le Compte | 156/313 |
| 4,536,525 A | * | 8/1985 | Freese et al. | 523/414 |
| 4,942,076 A | * | 7/1990 | Panicker et al. | 428/137 |
| 5,154,944 A | * | 10/1992 | Klerken | 430/39 |
| 5,428,023 A | * | 6/1995 | Russell-Jones et al. | 514/21 |
| 6,479,763 B1 | * | 11/2002 | Igaki et al. | 174/262 |
| 6,981,317 B1 | * | 1/2006 | Nishida | 29/840 |
| 7,402,909 B2 | | 7/2008 | Suh et al. | 257/753 |
| 2001/0003610 A1 | * | 6/2001 | Nakatani et al. | 428/131 |
| 2001/0005060 A1 | * | 6/2001 | Ohuchi et al. | 257/788 |
| 2002/0142494 A1 | * | 10/2002 | Farnworth et al. | 438/14 |
| 2003/0135997 A1 | * | 7/2003 | Watanabe et al. | 29/852 |
| 2003/0222343 A1 | * | 12/2003 | Sakaida | 257/737 |
| 2006/0145302 A1 | * | 7/2006 | Kim et al. | 257/629 |
| 2007/0235840 A1 | | 10/2007 | Eitan et al. | 257/621 |
| 2007/0275540 A1 | | 11/2007 | Hackitt et al. | 438/460 |
| 2007/0278635 A1 | | 12/2007 | Xu et al. | 257/678 |

* cited by examiner

*Primary Examiner*—Charles D Garber
*Assistant Examiner*—Pape Sene
(74) *Attorney, Agent, or Firm*—Konrad Raynes & Victor LLP; Alan S. Raynes

(57) ABSTRACT

The formation of electronic assemblies including a die having through vias is described. In one embodiment, a method includes providing Si die including a first surface and a second surface opposite the first surface, and forming a via extending through the Si die from the first surface to the second surface. The via is formed to have a larger width at the first surface than at the second surface, the larger width at the first surface being no less than 100 microns. The method also includes placing a plurality of particles in the via, wherein at least some of the particles comprise a polymer and at least some of the particles comprise a metal. The method also includes heating the die and the particles in the via to cross-link at least part of the polymer in the via, and cooling the die to solidify the polymer and form a electrically conductive composite including the cross-linked polymer and the metal in the via. Other embodiments are described and claimed.

20 Claims, 4 Drawing Sheets

IN-SITU FORMATION OF CONDUCTIVE FILLING MATERIAL IN THROUGH-SILICON VIA

RELATED ART

Integrated circuits may be formed on semiconductor wafers that are formed from materials such as silicon. The semiconductor wafers are processed to form various electronic devices thereon. At some point during the processing, the wafers may be diced into semiconductor chips (a chip is also known as a die), and attached to a substrate using a variety of known methods. In certain applications, a plurality of chips are stacked together. At least one of the stacked chips may be formed with through-silicon vias (TSV's) extending therethrough. The through-silicon via may provide a shorter connection path than other connection mechanisms.

Incomplete filling of through-silicon vias with conductive material during conventional processing operations leads to the formation of voids. FIG. 1 shows a view of die 2 including through-silicon vias coated with a conductive layer 7 that extends onto the lower surface of the die 2. A conductive paste 6 is positioned in the via and as seen in FIG. 1, voids 8 are formed in the via. Such voids 8 lead to reliability and performance problems.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to in-situ methods for forming a conductive filling in through-silicon vias in a wafer level process. Embodiments may include methods and the devices formed.

Figure 1:
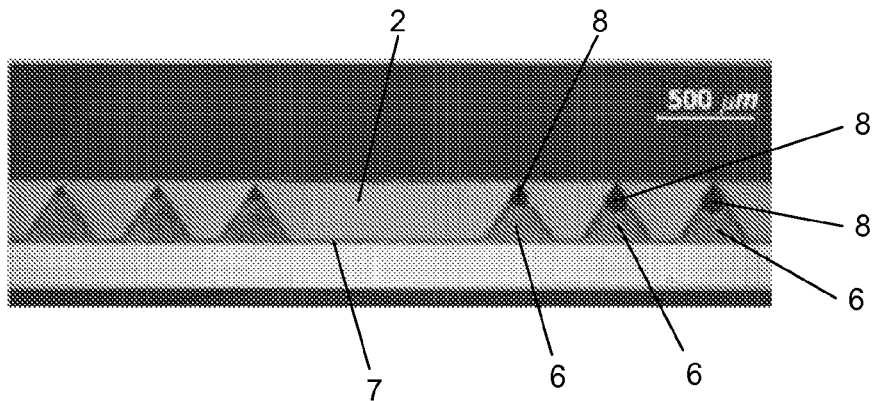
FIG. 1 illustrates a photomicrograph including a silicon wafer having through silicon vias that contain a conductive paste therein, and voids formed in the vias.
Figure 2:
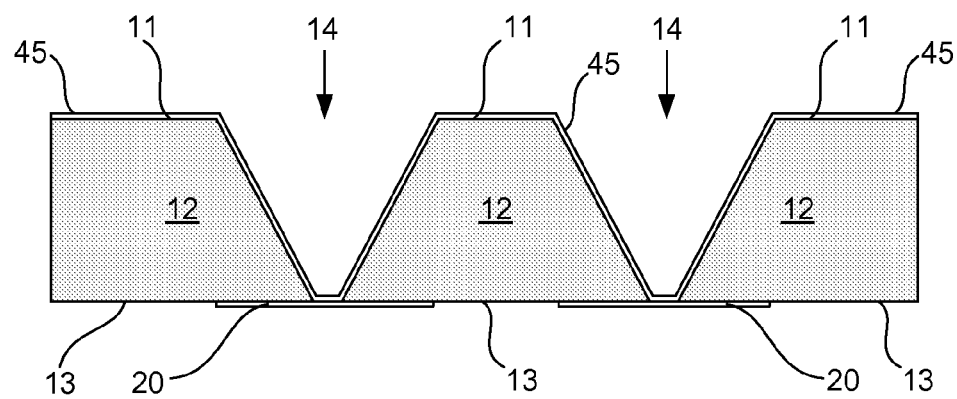
FIG. 2 illustrates a wafer having vias formed therein, used in accordance with certain embodiments.

FIG. 2 illustrates a portion of a wafer 12, which may be formed from silicon, having a plurality of vias 14 extending therethrough. The vias 14 may be formed so that they are considerably wider on a surface 11 of the wafer 12 than on the opposite surface 13 of the wafer 12, as seen in FIG. 2. This may be accomplished using suitable etching methods, for example, chemical etching. In certain embodiments, the width of the vias 14 at the surface 11 is not less than 100 microns. In other embodiments, the width is of the vias 14 at the surface 11 may be in the range of about 250-500 microns. Such vias are sometimes referred to as large format through-silicon vias.

At one end of the vias 14, on the surface 11 of the wafer 12, an electrically conductive layer 20 is formed to cover the via 14 opening. The electrically conductive layer 20 may be a metal layer formed from, for example, copper or gold. As used herein, the term metal includes pure metals and alloys. In certain embodiments, the electrically conductive layer 20 will be electrically coupled to another die. The wafer 12 may also include a suitable thin metal layer 45 formed within the vias 14 and on the surface 13 of the wafer 12. In certain embodiments the thin metal layer 45 may be formed from the same material as the electrically conductive layer 20.

Figure 3A:
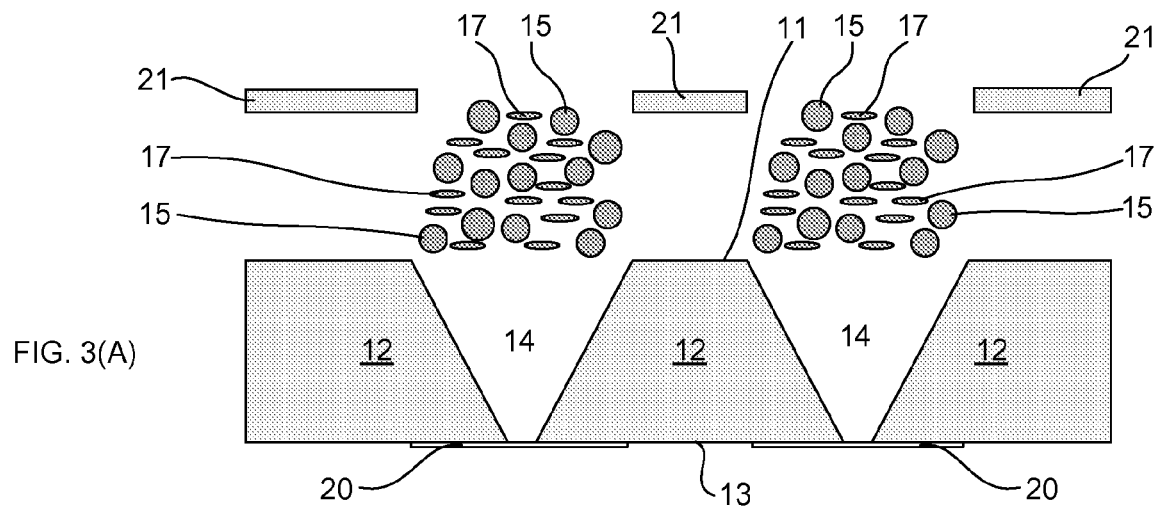
FIG. 3(A)-3(C) illustrate processing operations for forming a composite material in the vias of FIG. 2, in accordance with certain embodiments.
Figure 3B:
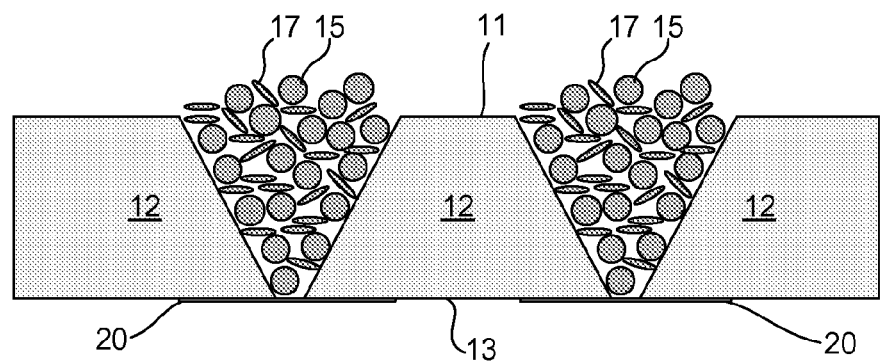
Figure 3C:
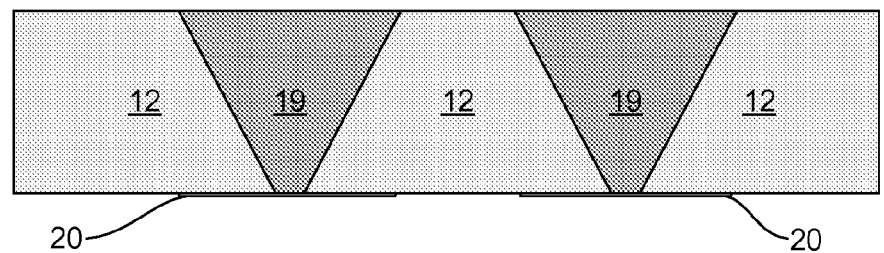

FIGS. 3(A)-3(C) illustrate processing operations on the wafer 12, in accordance with certain embodiments. As illustrated in FIG. 3(A), discrete particles 15, 17 are delivered to the via 14. The particles 15 may be formed from a polymer material, while the particles 17 may be formed from a metal, including, but not limited to, a highly conductive metal such as silver. The ratio of metal particles 17 to polymer particles 15 can be optimized to achieve suitable electrical and thermal conductivity, as well as other properties such as adhesion and mechanical strength.

The discrete polymer particles 15 and discrete metal particles 17 may be delivered to the vias 14 using a variety of suitable methods. One method includes a sieving process, which uses a stencil 21 having openings aligned with the via locations over the wafer 12. The polymer particles 15 and the metal particles 17 are then delivered to the vias through the openings in the stencil 21. The polymer particles 15 and the metal particles 17 are configured in a solid form when delivered to the vias 14. Such delivery may in certain embodiments be carried out at a normal room temperature. It is not necessary to have the materials delivered to the via 14 in a liquid or paste form when delivered to the vias 14.

FIG. 3(B) illustrates the discrete polymer particles 15 and metal particles 17 positioned in the via 14. The particles 15, 17 may overfill the via 14. The wafer is then heated to cure the mixture. During the curing at least some of the polymer particles 15 cross-link and the anisotripic conductivity of the polymer and metal composite is developed. After curing the wafer is cooled and, as illustrated in FIG. 3(C), the resultant composite material 19 includes a cross-linked polymer and metal matrix in the vias 14. If shrinkage causes the via to be incompletely filled, another operation of filling (or overfilling) the via 14 with the discrete polymer particles 15 and metal particles 17, followed by a curing operation, may be carried out.

The composite material 19 shown in FIG. 3(D) is electrically coupled to the layer 20 on surface 11 of the wafer 12. The layer 20 may in turn be coupled to another component during other processing operations.

Figure 4A:
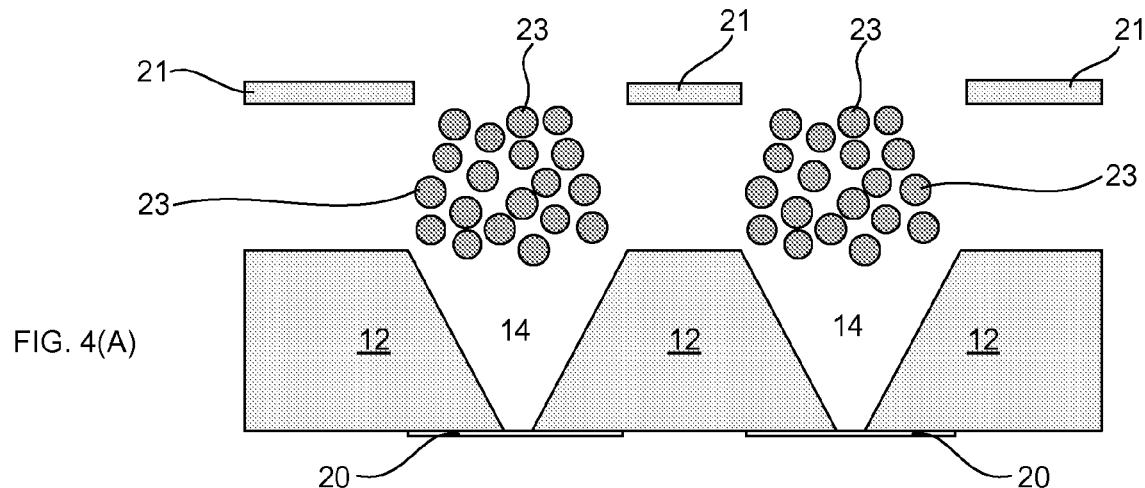
FIGS. 4(A)-4(C) illustrate processing operations for forming a composite material in the vias of FIG. 2, in accordance with certain embodiments.
Figure 4B:
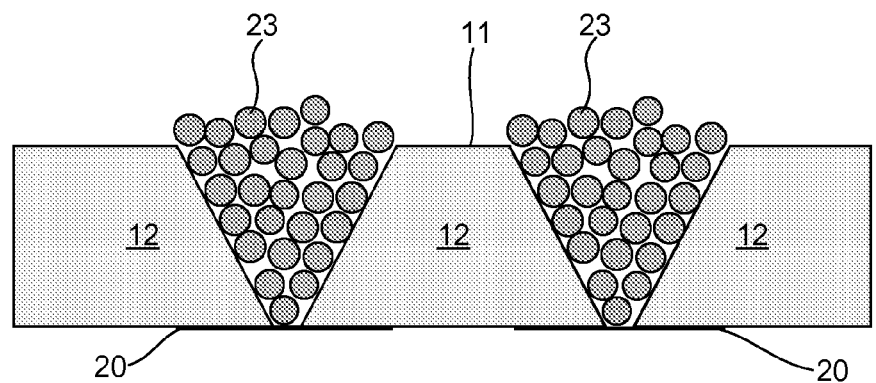
Figure 4C:
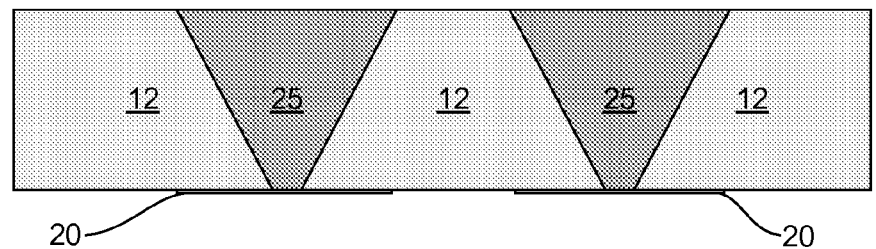

FIGS. 4(A)-4(C) illustrates a slightly different method that that described in connection with FIGS. 3(A)-3(C). In the method of FIGS. 4(A)-4(C), particles 23 may be delivered to the vias 14 in a similar manner as the particles 15, 17 described above. However, instead of using separate particles of polymer and metal, the particles 23 of FIG. 4(A) include both polymer and metal in the same particle. The metal may in certain embodiments include, but is not limited to, silver. The relative amount of polymer versus metal in the particles 23 is controlled so that the resultant composite formed will provide suitable electrical and thermal conductivity, as well as other properties such as adhesion and mechanical strength. Similar to the method described above in connection with FIGS. 3(A)-3(C), the particles 23 are configured in a solid form when delivered to the vias 14. Such delivery may in certain embodiments be carried out at a normal room temperature. It is not necessary to have the materials delivered to the via 14 in a liquid or paste form when delivered to the vias 14.

The use of a single type of particle 23, including both polymer and metal may allow for better initial packing within the vias 14, depending on the size and shape of the particles 23 versus the size and shape of the two different types of particles 15, 17 of the method described above. In certain embodiments, it is believed that the use of only one type of particle 23, including both polymer and metal, may allow for better homogeneity and more precise control of the metal content in the composite.

As in the method described earlier, the particles 23 may be delivered using a variety of methods, including a sieve method using stencil 21, as illustrated in FIG. 4(A). The particles are delivered to the via 14 and may overfill the via 14, as illustrated in FIG. 4(B). The wafer is then heated to cure the mixture. During the curing at least some of the polymer from the particles 23 will cross-link and the anisotripic conductivity of the polymer and metal composite is developed. After curing the wafer is cooled and, as illustrated in FIG. 4(C), the resultant composite material 25 includes a cross-linked polymer and metal matrix in the vias 14. If shrinkage causes the via to be incompletely filled, another operation of filling (or overfilling) the via 14 with the particles 23, followed by a curing operation, may be carried out.

The composite material 25 shown in FIG. 4(D) is electrically coupled to the layer 20 on surface 11 of the wafer 12. The layer 20 may in turn be coupled to another component during other processing operations.

The methods described above maybe performed on an entire wafer, prior to singulation, or may be performed on a portion of a wafer (e.g., a die) after singulation. In addition, a variety of suitable additives may be included with the particles in the methods described above. For example, at least some of the particles may be coated with one or more additives, including, but not limited to, a rheology modifier and a coupling agent. A rheology modifier coating may act to improve the homogeneity of the composite structure formed, and a coupling agent may act to assist in coupling the composite to the sidewalls defining the via. For embodiments using both metal particles and polymer particles, certain additives may be of more benefit when coated on only one type of particle, for example, the metal particles. In addition, the embodiments described in connection with FIGS. 3(A)-3(C), 4(A)-4(C), and 5 may include a thin metal layer such as the layer 45 in FIG. 2, positioned in the vias 14 and on the substrate surface 11.

Embodiments such as those described above permit vias such as large format through-silicon vias to be completely filled, with little or no voiding. In one embodiment, the filled wafer (such as those illustrated in FIGS. 3(C) and 4(C)), may go through a reflow operation, then a wafer preparation operation, and a die attach operation of individual dies onto substrates. Processing operations to form a final electronic assembly may include the die attach and cure, plasma processing, wire bonding, epoxy molding, singulation, marking, and final inspection. In general, a wafer having through-silicon vias with a shape that needs to be filled with conductive media, in order to achieve a suitable electrical grounding performance, may find particular benefit when formed in accordance with embodiments described above. Such wafers may be used in the formation of electronic components including, but not limited to, RF (radio frequency) packages such as RF SIP (System-in-Package) components.

Figure 5:
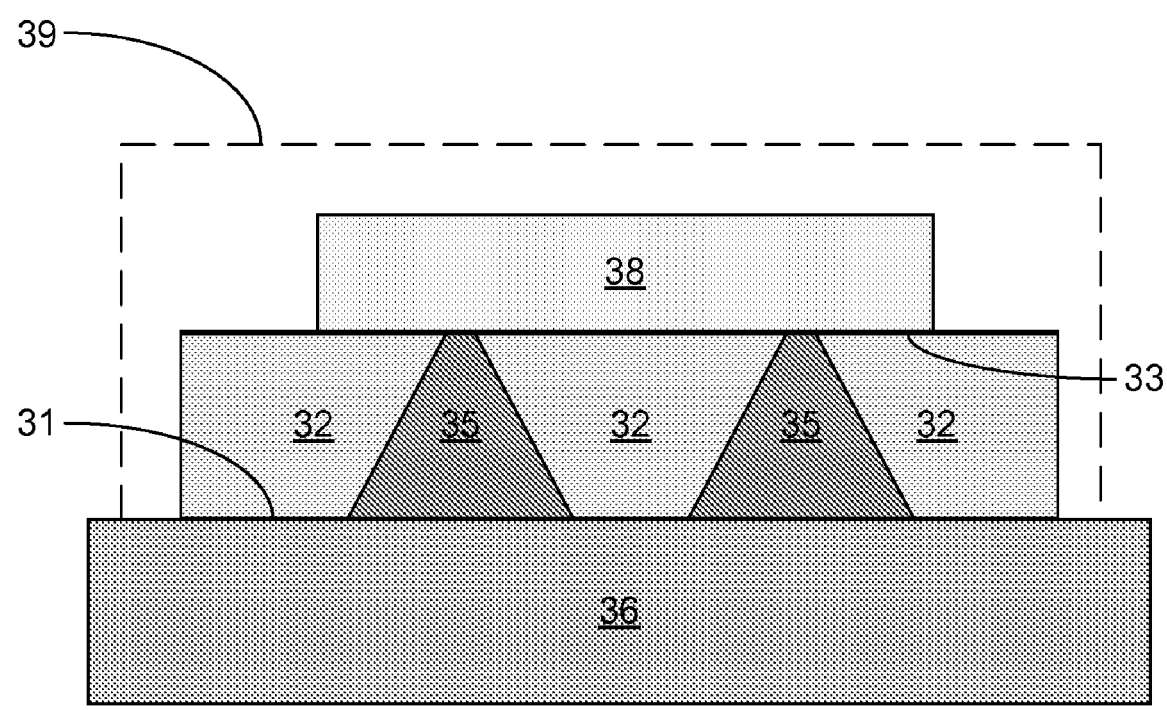
FIG. 5 illustrates an electronic assembly formed in accordance with certain embodiments.

FIG. 5 illustrates an electronic assembly formed in accordance with certain embodiments such as those described above. The electronic assembly of FIG. 5 includes a die 32 and composite material 35 in through-silicon vias, formed using one of the methods explained above in connection with FIGS. 3(A)-3(C) and 4(A)-4(C). A surface 31 of the die 32 is coupled to substrate 36, and the opposite surface 33 of the die 32 is coupled to the additional die 38. The die 32 may be in certain embodiments be used as a silicon back plane die. The additional die 38 may in certain embodiments be used as a functional die, which includes a number of functioning devices that require grounding. The silicon back plane die may be electrically coupled to the functional die to the regions requiring grounding.

As an example, the additional die 38 may be a RF integrated circuit or a passive device such as, for example, a power amplifier. The additional die 38 may be coupled to the die 32 using, for example, a suitable conductive die attach paste. In addition, a suitable encapsulant may be formed over the die 38 and die 32 within the region indicated by the dotted line 39. As noted above, examples of components that may include a structure such as that of FIG. 5 include, but are not limited to, RF components.

The foregoing description has been presented for the purposes of illustration and description. It is not intended to be exhaustive or to limit to the precise form disclosed. Many modifications and variations are possible in light of the above teachings.

What is claimed:

1. A method comprising:
   providing at least a portion of a semiconductor wafer;
   forming a plurality of vias extending through the wafer;
   delivering a plurality of particles to the vias in the wafer, wherein at least some of the particles comprise a polymer in solid form and at least some of the particles comprise a metal in solid form;
   wherein a plurality of the particles include both the polymer and the metal within the same particle;
   wherein the delivering the sluralit of particles to the vias is carried out using a sieving process, the sieving process including using a stencil having openings matching via locations over the wafer, and delivering the plurality of particles to the vias through the openings in the stencil;
   after the delivering the plurality of particles to the vias, applying heat to cross-link at least part of the polymer in the vias; and
   after the applying heat, cooling the polymer;
   wherein a composite material comprising the cross-linked polymer and the metal is formed in the vias.

2. The method of claim 1, wherein the metal comprises silver.

3. The method of claim 1, further comprising coating at least some of the particles with at least one additive selected from the group consisting of a rheology enhancer and a coupling agent, prior to the delivering the mixture of particles to the vias.

4. The method of claim 1, wherein the vias extend through the wafer from a first surface to a second surface, and further comprising forming the vias so that an individual via has a width on the first surface that is larger than a width on the second surface,
   wherein the width on the first surface is no smaller than 100 microns.

5. The method of claim 4, further comprising forming a metal layer that covers the via on the second surface of the wafer, wherein the metal layer is in electrical contact with the composite material in the via.

6. A method comprising:
   providing a silicon body including a first surface and a second surface opposite the first surface;
   forming a via extending through the silicon body from the first surface to the second surface, the via having a larger width at the first surface than at the second surface, the larger width at the first surface being no less than 100 microns;

delivering a plurality of particles to the via, wherein at least some of the particles comprise a polymer in solid form and at least some of the particles comprise a metal in solid form;

wherein the plurality of particles includes particles that include the polymer and the metal within the same particle;

after the delivering the plurality of particles to the via, applying heat to cross-link at least part of the polymer in the via; and after the applying heat, cooling the polymer;

wherein an electrically conductive composite including the cross-linked polymer and the metal is formed in the via.

7. The method of claim 6, wherein the metal comprises silver.

8. A method comprising:

providing a semiconductor body, the semiconductor body including a first surface and a second surface;

forming a plurality of vias in the semiconductor body, wherein the vias extend through the semiconductor body from the first surface to the second surface, wherein the vias are formed so that an individual via has a width on the first surface that is larger than a width on the second surface;

forming a metal layer on the second surface, wherein the metal layer covers the vias on the second surface of the semiconductor body;

delivering a material to the vias, the material comprising a plurality of particles comprising both a polymer in solid form and a metal in solid form in the same particle;

after the delivering the material to the vias, applying heat to cross-link at least part of the polymer in the vias; and cooling the polymer in the vias after the applying heat;

wherein a composite material including the cross-linked polymer and the metal is formed in the vias.

9. The method of claim 8, wherein the metal comprises silver.

10. A method comprising:

providing a semiconductor body;

forming a plurality of vias in the semiconductor body;

delivering a material to the vias, the material comprising a plurality of particles comprising both a polymer in solid form and a metal in solid form in the same particle;

wherein the delivering the material to the vias is carried out using a sieving process, the sieving process including using a stencil having openings matching via locations over the wafer, and delivering the plurality of particles to the vias through the openings in the stencil; and after the delivering the material to the vias, applying heat to cross-link at least part of the polymer in the vias;

wherein a composite material including the cross-linked polymer and the metal is formed in the vias.

11. The method of claim 8, comprising providing a coating on at least some of the particles, the coating comprising at least one additive selected from the group consisting of a rheology enhancer and a coupling agent, prior to the delivering the material to the vias.

12. The method of claim 8, further comprising delivering the material to the vias using a sieving process, the sieving process including using a stencil having openings matching via locations over the wafer, and delivering the plurality of particles to the vias through the openings in the stencil.

13. The method of claim 8, wherein the width on the first surface is in the range of 250 microns to 500 microns.

14. The method of claim 10, wherein the metal comprises silver.

15. The method of claim 10, comprising providing a coating on at least some of the particles, the coating comprising at least one additive selected from the group consisting of a rheology enhancer and a coupling agent, prior to the delivering the material to the vias.

16. The method of claim 10, the semiconductor body including a first surface and a second surface, further comprising forming a metal layer on the second surface, wherein the vias extend through the wafer from the first surface to a second surface, and further comprising forming the vias so that an individual via has a width on the first surface that is larger than a width on the second surface, wherein the metal layer covers the via on the second surface of the semiconductor body.

17. The method of claim 1, wherein the vias extend through the wafer from a first surface to a second surface, and further comprising forming the vias so that an individual via has a width on the first surface that is larger than a width on the second surface, wherein the width on the first surface is in the range of 250 microns to 500 microns.

18. The method of claim 6, further comprising coating at least some of the particles with at least one additive selected from the group consisting of a rheology enhancer and a coupling agent, prior to the delivering the mixture of particles to the vias.

19. The method of claim 6, further comprising forming a metal layer that covers the via on the second surface of the wafer, wherein the metal layer is in electrical contact with the electrically conductive composite in the via.

20. The method of claim 6, wherein the larger width at the first surface is in the range of 250 microns to 500 microns.

* * * * *

UNITED STATES PATENT AND TRADEMARK OFFICE
CERTIFICATE OF CORRECTION

| | | |
|---|---|---|
| PATENT NO. | : 7,851,342 B2 | Page 1 of 1 |
| APPLICATION NO. | : 11/694902 | |
| DATED | : December 14, 2010 | |
| INVENTOR(S) | : Xu et al. | |

It is certified that error appears in the above-identified patent and that said Letters Patent is hereby corrected as shown below:

In the Claims:

Column 4, Line 33, "the sluralit of particles" should read --the plurality of particles--.

Signed and Sealed this
Twenty-seventh Day of October, 2015

Michelle K. Lee
*Director of the United States Patent and Trademark Office*